United States Patent
Conrad et al.

(10) Patent No.: US 6,735,492 B2
(45) Date of Patent: May 11, 2004

(54) FEEDBACK METHOD UTILIZING LITHOGRAPHIC EXPOSURE FIELD DIMENSIONS TO PREDICT PROCESS TOOL OVERLAY SETTINGS

(75) Inventors: Edward W. Conrad, Jeffersonville, VT (US); John S. Smyth, Milton, VT (US); Charles A. Whiting, Milton, VT (US); David A. Ziemer, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 10/199,789

(22) Filed: Jul. 19, 2002

(65) Prior Publication Data
US 2004/0015256 A1 Jan. 22, 2004

(51) Int. Cl.⁷ .............................................. G06F 19/00
(52) U.S. Cl. ........................ 700/121; 700/95; 700/117; 438/5; 438/14
(58) Field of Search ............................ 700/28, 90, 95, 700/117, 121; 438/5, 7, 14; 702/81

(56) References Cited

U.S. PATENT DOCUMENTS

| 4,703,434 A | 10/1987 | Brunner |
| 5,757,507 A | 5/1998 | Ausschnitt et al. |
| 5,877,861 A | 3/1999 | Ausschnitt et al. |
| 5,894,350 A | 4/1999 | Hsieh et al. |
| 6,079,256 A | 6/2000 | Bareket |
| 6,128,070 A | 10/2000 | Peng |
| 6,269,322 B1 | 7/2001 | Templeton et al. |
| 6,304,999 B1 * | 10/2001 | Toprac et al. ................... 716/4 |
| 6,400,445 B2 | 6/2002 | Nishi et al. |
| 6,645,780 B1 * | 11/2003 | Sonderman et al. .......... 438/14 |

OTHER PUBLICATIONS

IBM Technical Disclosure Bulletin; Babinski et al.; Exposure Field Alignment System; IBM Corp. 1987; pp. 4286–4287; vol. 29, No. 10.

* cited by examiner

Primary Examiner—Jayprakash N. Gandhi
(74) Attorney, Agent, or Firm—McGinn & Gibb, PLLC; William D. Sabo, Esq.

(57) ABSTRACT

A system and method of monitoring and predicting tool overlay settings comprise generating current lot information, generating historical data, categorizing (binning) the historical data into discrete exposure field size ranges, and predicting current lot tool overlay settings based on the current lot information and historical data. The method monitors the overlay errors during each lot pass through each lithographic process operation. Moreover, the method uses a feedback sorting criteria to monitor the tool overlay settings. Furthermore, the current lot information comprises lithographic field dimensions, wherein the lithographic field optics distortion data is derived from the current lithographic process tool. Additionally, the historical data comprises same-bin lithographic field size dimensions of previous lots, which statistically means the data is derived from the same (or similar) bin of like lots, on the current lithographic process tool.

32 Claims, 6 Drawing Sheets

FEEDBACK METHOD UTILIZING LITHOGRAPHIC EXPOSURE FIELD DIMENSIONS TO PREDICT PROCESS TOOL OVERLAY SETTINGS

BACKGROUND OF THE INVENTION

1. Field of the Invention

The present invention generally relates to integrated circuit manufacturing processes and, more particularly to the relative overlay (placement) error inherent in lithographic processes used to align successive lithographic layers on a semiconductor wafer during semiconductor manufacturing.

2. Description of the Related Art

In the practice of semiconductor manufacturing, lithography is used to replicate designed device structures on a target semiconductor wafer, which is typically 125–300 mm in diameter. To achieve this, each device design is decomposed into a series of process steps, each defined by structures of a lithographic pattern or "level". Current state-of-the-art semiconductor devices require 20–40 of these lithographic levels to achieve desired functionality. Pattern transfer is achieved by first transferring a magnified version of the level to a photomask, wherein the device design is represented by optically opaque regions on an optically transparent substrate. Today's state-of-the-art photomask consists typically of chromium/chromium oxide opaque regions supported by a quartz substrate. Light of an appropriate wavelength, typically 193 nm–365 nm, is projected through the photomask, through reducing optics, and focused onto the target wafer, which is coated with a photosensitive polymer (photoresist). Photoresist that is exposed to the light is altered with respect to its solubility characteristics, permitting a developer to selectively remove soluble photoresist and leave the desired device pattern on the wafer.

The devices ("chips") to be created on the wafer vary in size typically from 2 to 25 mm, and are usually arranged at a uniform periodicity across the wafer to substantially cover its surface. Because today's state-of-the-art lithography equipment uses reducing optics, and optical elements printing larger than about 30 mm square area are impractical, it is impossible to lithographically transfer ("print") all structures simultaneously across the full wafer. Thus, each level requires multiple exposures to populate the wafer with device patterns completely. This is accomplished by grouping a number of devices per level into a repeating unit, or "field", which is sequentially exposed on the wafer surface until all desired device patterns have been completed. Each field may contain between one to hundreds of chips, constrained primarily by how many chips of each size will fit inside the lithographic (optics) exposure field.

To achieve semiconductor device functionality, it is necessary that the placement of the images at the wafer plane of the current lithographic layer, relative to a prior layer, be within a certain tolerance. This relative placement can be referred to as the "overlay". Overlay errors are typically algebraically decomposed into two groups, errors that can be corrected (minimized) by the exposure equipment ("correctable" or "systematic" errors), and errors that are not easily correctable (remaining, or "residual" errors). Overlay is optimized by adjusting tool settings corresponding to the systematic errors. For today's state-of-the-art exposure systems, correctable errors typically include zeroth order terms (X and Y translation), as well as first-order terms relating to both the exposure field and the wafer as a whole (Magnification, Rotation, and X/Y axis non-orthogonality).

For lithographic levels which require minimum overlay to a prior level, the initial step in the process requires aligning the photomask from the current level to the prior level images on the wafer, exposing the wafer with a plurality of lithographic fields, recording tool overlay settings used for this exposure, and developing the exposed images. To determine the overlay error, specific structures from both the prior level and current level are measured. From these structures, the overlay error between the current and a prior level can be calculated. If the error is larger than the tolerance required for functionality, the photoresist images are removed ("reworked"), and improved estimates for tool settings ("corrections") are determined from the original tool overlay settings and the measured errors. This feedback method is repeated until overlay is found to be within tolerances.

Because reworking wafers is costly, it is desirable to avoid multiple iterations/reworks at each lithographic level. A method which predicts tool overlay settings which will produce overlay errors within the acceptable tolerance during each level's first iteration is thus highly desired.

Silicon wafers are typically processed through the fabricator in physically distinct and uniquely identified groups, and are referred to as "batches" or "lots". "Lot" will be used subsequently with this meaning in mind.

Other conventional methods and devices teach aspects of overlay monitoring, such as U.S. Patent Application Publication No. US2001/0016293 (teaches use of current lot data and two sensing systems to detect a first mark and a street line to which subsequent wafers are compared); U.S. Pat. No. 5,894,350 (teaches a two pass method for correcting offset errors comprising shooting a second alignment mark on a resist covered wafer, using light that will not expose the resist, while optically measuring the overlay offset which is fed back for tool correction); U.S. Pat. No. 5,877,861 (teaches an overlay control system in which interlevel and intralevel data is collected and used to generate offsets fed back to the steppers); U.S. Pat. No. 6,269,322 (teaches an overlay process generated using two printed reticle alignment marks and a third virtual alignment mark midway between the two printed marks); U.S. Pat. No. 6,128,070 (teaches monitoring overlay using a plurality of alignment marks on the initial layer of the wafer, and then using a triangle geometric equation for offset errors of subsequent layer's overlaying alignment marks); U.S. Pat. No. 6,079,256 (teaches a method of measuring registration accuracy using a periodic grating made from a composite of two successive layers of photolithography); U.S. Pat. No. 5,757,507 (teaches monitoring overlay error on product wafers using a test pattern and optical measuring tools); U.S. Pat. No. 4,703,434 (teaches a method of measuring overlay error using optical tools and grating patterns); IBM Technical Disclosure Bulletin Vol. 29, No. 10, March 1987, pp. 4286–87 (teaches alignment marks in each exposure field that are used and a previously calculated theta correction that is applied; and a calculated motion to a best overlay position of a first exposure field that is used to position the wafer and expose the first field); the complete disclosures of which are herein incorporated by reference.

SUMMARY OF THE INVENTION

In view of the foregoing and other problems, disadvantages, and drawbacks of the conventional overlay monitoring systems and methods, the present invention has been devised, and it is an object of the present invention to provide a feedback method which utilizes lithographic exposure field dimensions to predict tool overlay settings. It is another object of the present invention to retrieve the systematic overlay errors for each lot passing through each lithographic process operation. Still, another object of the present invention is to use a feedback sorting criteria to monitor historical tool overlay settings. Yet another object of the present invention is to base the prediction of tool overlay settings on information more specific to the current lot. It is still another object of the present invention to implement a tool overlay setting prediction system in conjunction with any lithographic process tool type. Still another object of the present invention is to reduce cycle time and processing costs associated with integrated circuit chip manufacturing.

In order to attain the objects suggested above, there is provided, according to one aspect of the invention, a system and method of predicting tool overlay settings comprising generating current lot information, generating historical data of previous passes of lots, categorizing (binning) the historical data into discrete lithographic field size ranges, gathering current process tool lithographic field distortion data, and predicting current lot tool overlay settings based on the current lot information and related historical data.

The method monitors the overlay errors for each lot passing through the lithographic process operation. Moreover, the method uses a feedback sorting criteria to monitor the tool overlay settings. Furthermore, current lot information comprises lithographic field dimensions, from which the lithographic field optics distortion data is generated for the current lithographic process tool. Additionally, the historical data comprises the same-bin lithographic field size dimensions of previous lots, which statistically means the data is derived from the same (or similar) bin of like lots, on the current lithographic tool.

There are several benefits of the present invention. First, the present invention provides a system for using a feedback method utilizing lithographic exposure field dimensions to predict tool overlay settings for a lithographic process operation. Additionally, the present invention adds another criteria by which the tool overlay settings of historic lots can be sorted. Moreover, the present invention utilizes historical "like" (same-bin) "lots" process tool settings to predict current lot tool settings. As well, the present invention utilizes current process tool lithographic field lens distortion data to predict current lot process tool settings. Also, the present invention utilizes historical lithographic exposure field dimensions and associated process tool overlay settings to mathematically predict current lot lithographic process tool settings. A further benefit of the present invention is that it implements a process tool overlay setting prediction method applicable to any lithographic tool utilizing an imaging projection lens. Finally, the present invention reduces cycle time and processing costs associated with integrated circuit chip manufacturing.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
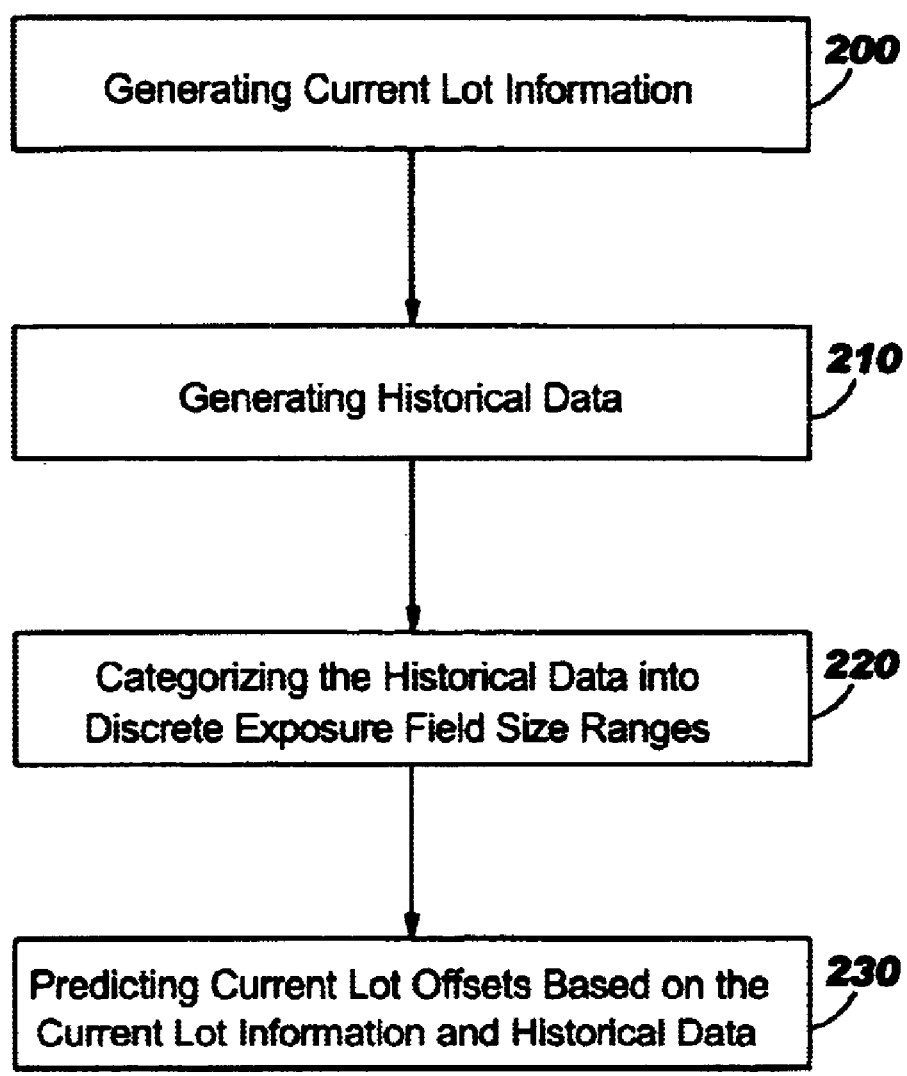
FIG. 1 is a flow diagram illustrating a preferred method of the invention.

As mentioned, there remains a need for a new feedback sorting criteria to substantially increase the likelihood of achieving overlay specifications for the first pass through the lithographic tool at each lithographic process operation. According to the present invention, additional sorting criteria is used in the overlay monitoring process, specifically lithographic exposure field size, in order to increase the likelihood of meeting overlay specifications on the first pass through the lithographic process tool, especially for first time use reticles, as well as Manufacturing WIP (Work-In-Progress) Profiles comprising many unique parts, each at low volumes. Referring now to the drawings, and more particularly to FIGS. 1 through 8, there are shown preferred embodiments of the method and structures according to the present invention.

The present invention includes a method for predicting process tool overlay settings based on the lithographic field size of the current lot. A method of generating tool overlay settings on a first pass through each lithographic operation is illustrated in a flow diagram shown in FIG. 1. The method comprises generating 200 current lot information, generating 210 historical data, categorizing (binning) 220 the historical data into discrete exposure field size ranges, and predicting 230 current lot process tool settings based on the current lot information and historical data.

The method monitors the tool overlay settings for each lot passing through each lithographic process operation. Moreover, the method uses a feedback sorting criteria to filter the process tool overlay settings. Furthermore, the current lot information comprises current lot lithographic field size dimensions, wherein the current lot lithographic lens distortion information is derived from the current lot lithographic process tool. Additionally, the historical data comprises a "same-bin" lithographic field size of previous lots processed on the current lithographic process tool, which statistically means the data is derived from the same (or similar) bin of previous lots.

Figure 2:
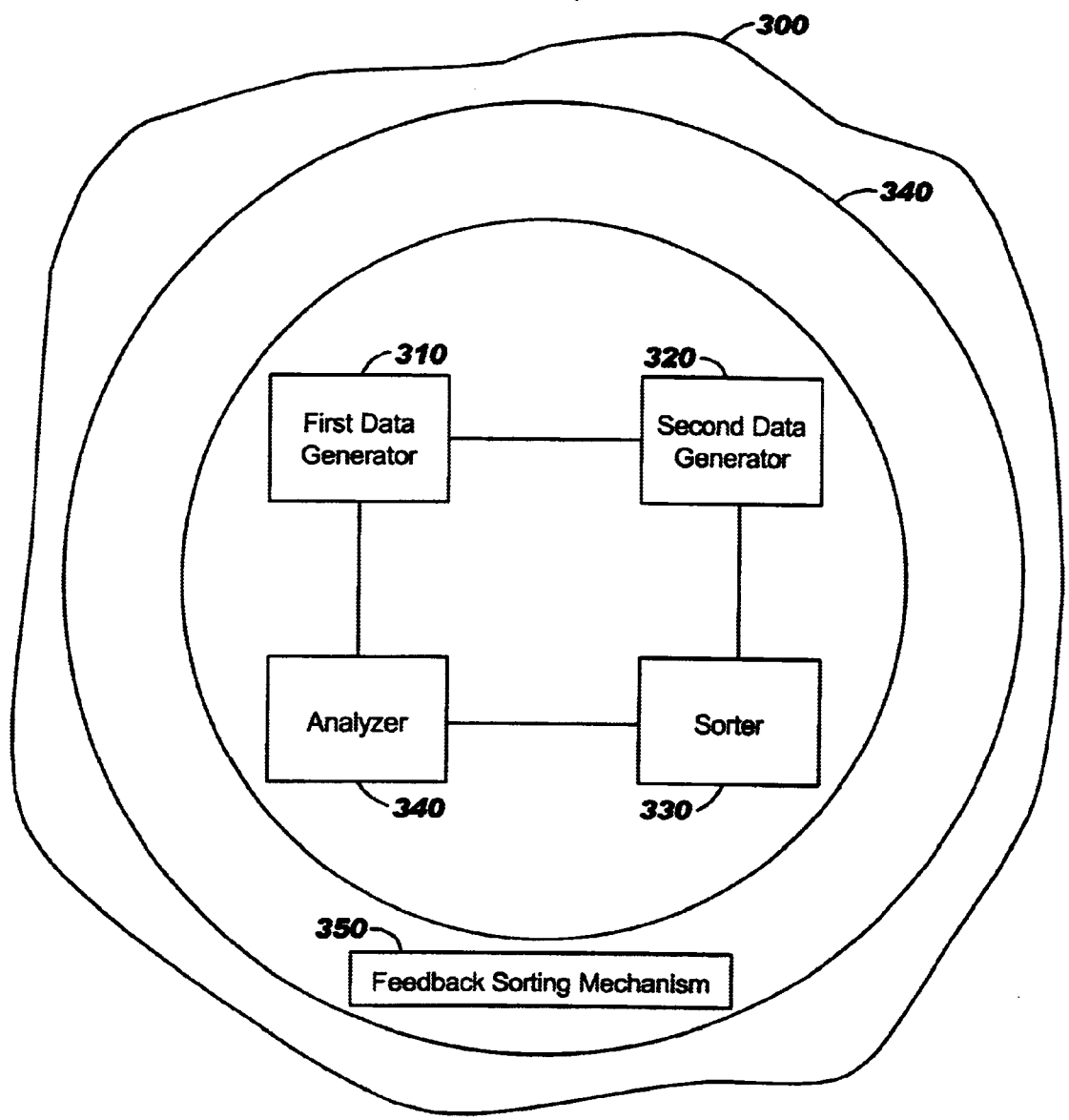
FIG. 2 is a system diagram according to the present invention.

A system 300 of monitoring tool overlay settings is illustrated in FIG. 2. The system 300 comprises a first data generator 310 comprising current lot information, a second data generator 320 comprising historical data (connected to the first data generator 310), a sorter 330 connected to the second data generator 320 for categorizing the historical data into discrete lithographic exposure field size ranges, and an analyzer 340 connected to the sorter 330 and first data generator 310 for predicting current lot process tool overlay settings based on the current lot information and historical data. Moreover, the system 300 includes a monitor 340 for monitoring the tool overlay settings for all lots passing through each lithographic photo process operation. Additionally, the system 300 comprises a feedback sorting mechanism 350 connected to the monitor 340 for generating the tool overlay settings.

Figure 3:
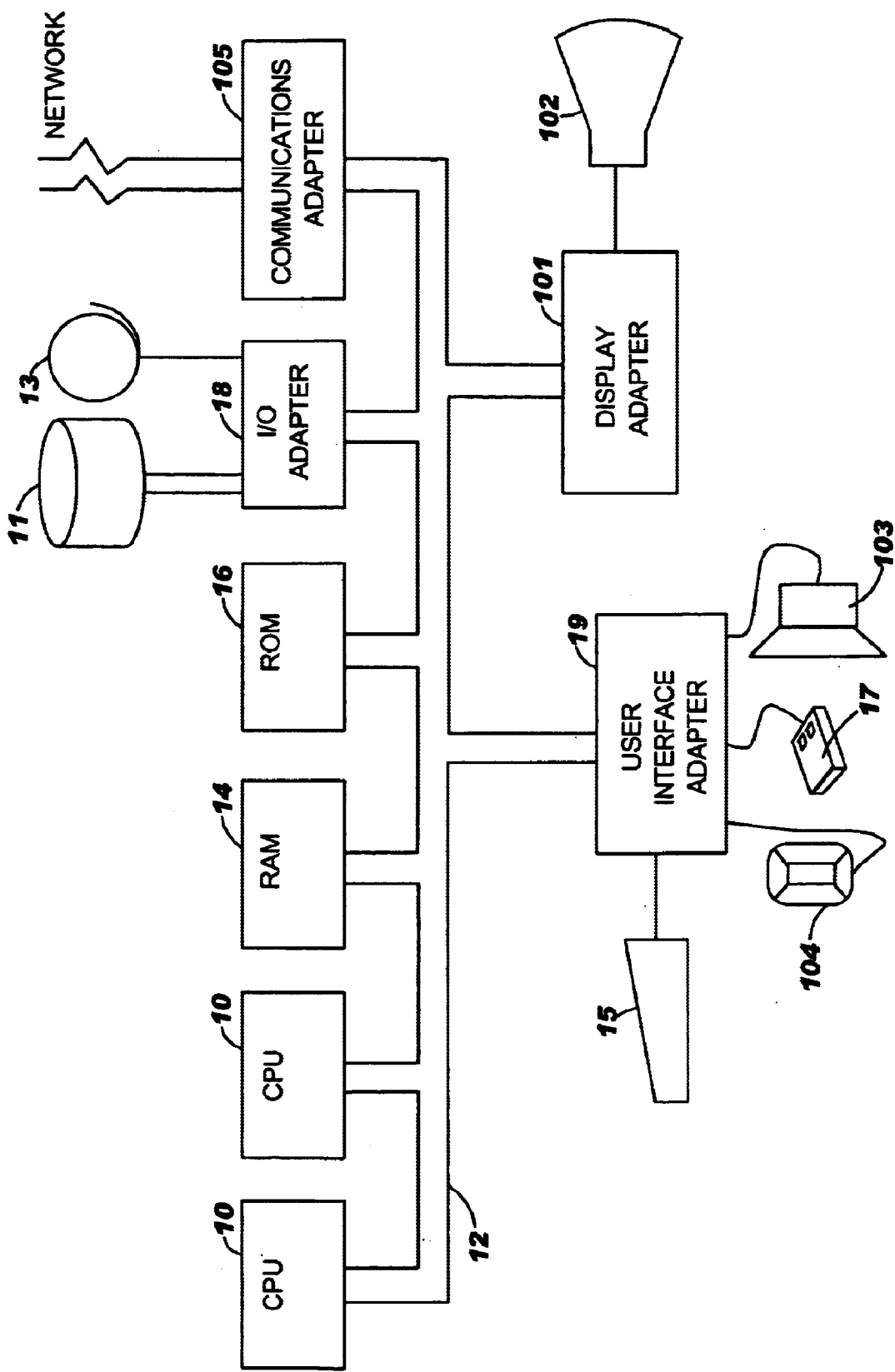
FIG. 3 is a system diagram according to the present invention.

A representative hardware environment for practicing the present invention is depicted in FIG. 3 which illustrates a typical hardware configuration of an information handling/computer system in accordance with the present invention, having at least one processor or central processing unit (CPU) 10. The CPUs 10 are interconnected via system bus 12 to random access memory (RAM) 14, read-only memory (ROM) 16, an input/output (I/O) adapter 18 for connecting peripheral devices, such as disk units 11 and tape drives 13, to the bus 12, user interface adapter 19 for connecting keyboard 15, mouse 17, speaker 103, microphone 104, and/or other user interface devices such as a touch screen device (not shown) to the bus 12, a communication adapter 105 for connecting the information handling system to a data processing network, and a display adapter 101 for connecting the bus 12 to a display device 102. A program storage device readable by the disk or tape units is used to load the instructions, which operate the invention, which is loaded onto the computer system.

Specifically, the method comprises utilizing up-to-date lithographic exposure field lens distortions data of each additional lithographic process tool in order to predict current lot tool overlay settings. A third and fourth order curve is generated to fit historical data for each performance parameter of a given tool, and the invention uses theses curves (equations) to predict offsets for each lot's lithographic field size information. In addition, the historical data for each tool is categorized (binned) into discrete lithographic field size ranges, wherein (in one embodiment) a prediction is made of the current lot tool overlay settings based only on the same-bin historical data.

In addition, the tool overlay setting prediction can be based on information more specific to the current lot, (rather than the mean of a much wider historical tool overlay setting distribution), such as either historical "similar lithographic field size" lots' data, or a lithographic field lens distortion character at the overlay measurement structure locations. Thus, the sorting refinement according to the present invention increases the likelihood of generating tool overlay settings that will permit the current lot to meet overlay requirements on the first pass through each lithographic process operation. Additionally, as overlay tolerances continue to shrink with each successive technology, the importance and value of the present more-specific feedback sorting option increases.

As level-to-level overlay tolerances become smaller, any inaccuracies, (or slop), in existing lithographic tool overlay setting prediction techniques become more pronounced, in that a higher proportion of lots fail to meet minimum overlay requirements on each first pass through the lithographic process step (because the first "estimate" was not close enough). The current invention takes each 'tool's existing data categorized into discrete exposure classes and uses it to generate tool overlay settings that are more likely to meet the overlay requirements, i.e., predicted tool settings that approach "ideal/perfect" tool settings sufficiently to meet the overlay requirements.

The present invention is applicable to all lithographic tools utilizing a lens that is subject to aberrations affecting image placement, including, but not limited to, lithographic illumination systems utilizing MUV (Mid UltraViolet) exposure wavelengths, DUV (Deep UltraViolet) exposure wavelengths, and 157 nm exposure wavelengths and beyond.

Figure 4:
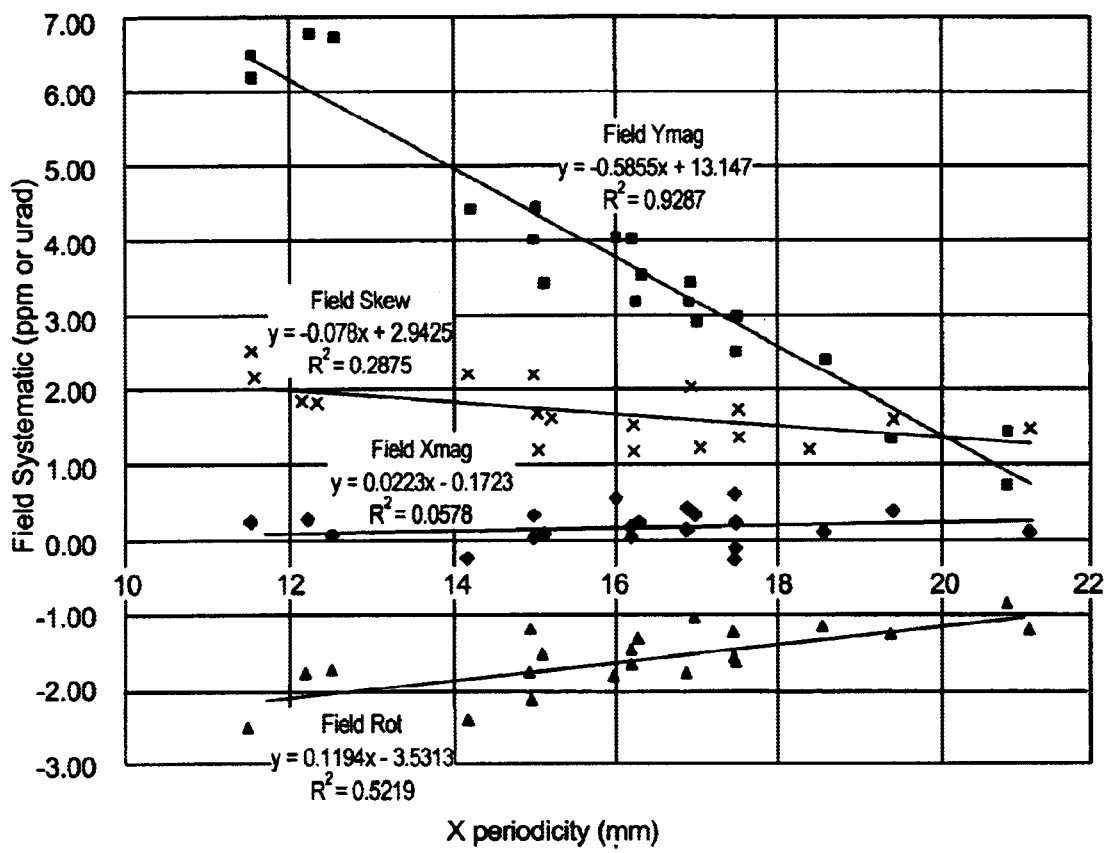
FIG. 4 is a first level field offset correlation graph.

FIG. 4 illustrates a first level field offset correlation graph, wherein the systematic components of the overlay errors, according to the present invention, are illustrated. Here, data from a "First Level" lithographic processing shows a strong negative correlation between Field Y Magnification and field height, as indicated by the curve represented by the equation:

$y=-0.5855x+13.147$ (with a strong coefficient of determination of 0.9287).

The data shows a relatively weak negative correlation between the Field Skew and field height, as indicated by the curve represented by the equation:

$y=-0.078x+2.9425$ (with a weak coefficient of determination of 0.2875).

The data also shows a very weak positive correlation between the Field X Magnification and field height, as indicated by the curve represented by the equation:

$y=0.0223x-0.1723$ (with a very weak coefficient of determination of 0.0578).

Finally, the data shows a relatively weak positive correlation between the Field Rotation and field height, as indicated by the curve represented by the equation:

$y=0.1194x-3.5313$ (with a relatively weak coefficient of determination of 0.5219).

This data indicates that both overlay errors and the associated lithographic field sizes of "historical lots" are monitored and available with the invention. The data is used to determine the mathematical relationship, which in turn is used to predict the specific tool overlay setting, (in this case YMmag), for the "current" lot. The data also indicates that the Field Size/Tool Overlay Setting correlation may vary depending on the particular Tool Setting, and the character of the specific process tool's lithographic lens distortion data.

Historical tool settings and the associated lithographic field sizes can be combined to improve the accuracy of "current lot" tool overlay settings. The history of a given tool can also be used to increase the accuracy of the first lithographic process step ("first level") in microchip fabrication. In this case, overlay is not relative to a prior level, but rather image placement is relative to an established baseline reference for a given tool and associated field size.

Figure 5:
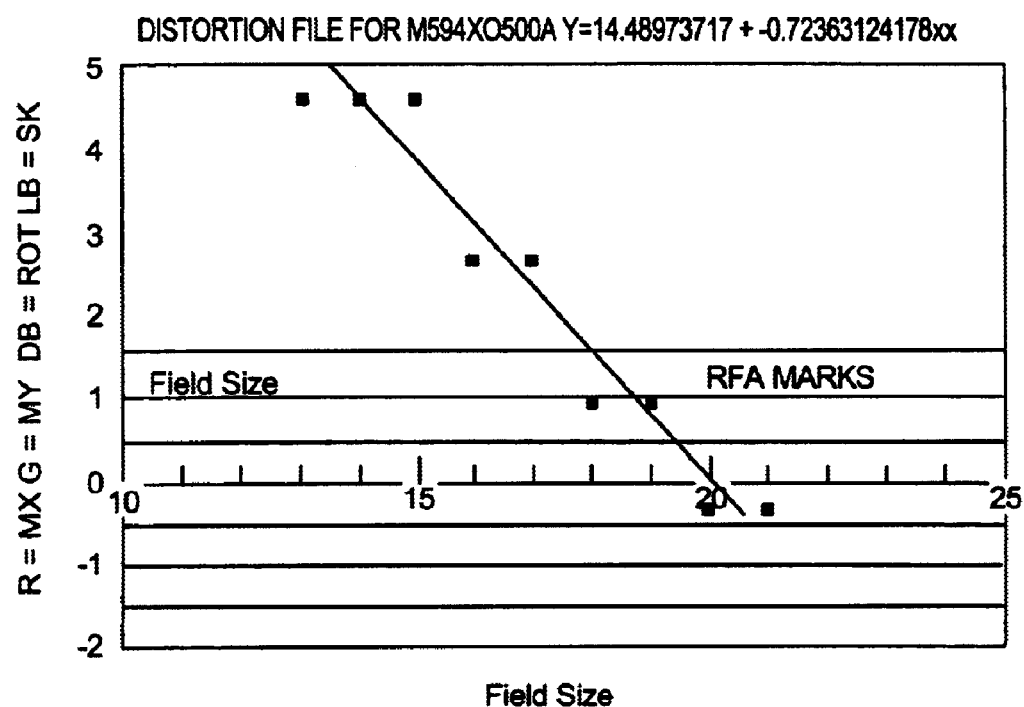
FIG. 5 is a modeled prediction graph of a first level field offset.

FIG. 5 illustrates a modeled first level field offset prediction graph, wherein the data from distortion mapping agrees with measured field offsets. This data illustrates a second means of predicting the "current lot" tool overlay settings. Using only the current lithographic lens distortion data of the current lithographic process tool, and current lot's exposure field size, the current lot's tool overlay settings can be more accurately predicted. Note that this is independent of using the historical lot's lithographic field size and associated tool overlay settings data.

Figure 6:
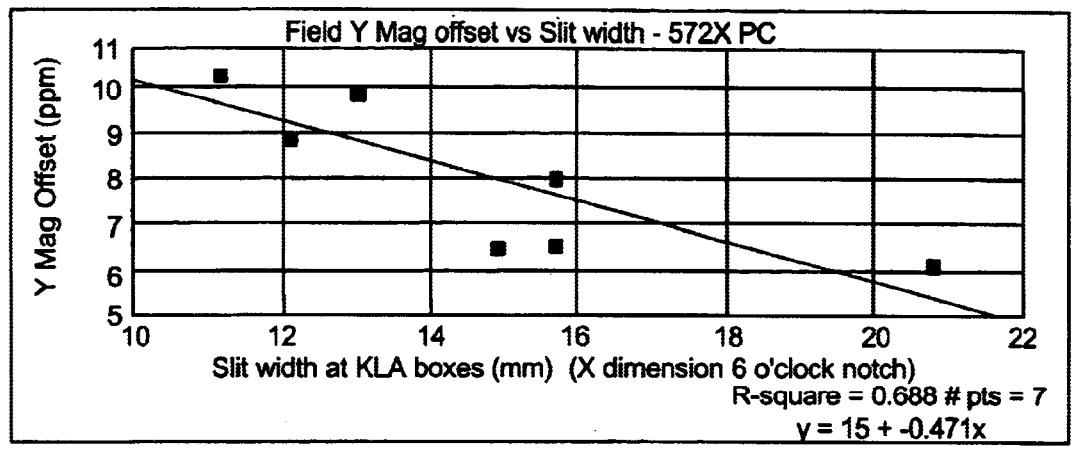
FIG. 6 is a gate level field magnification correlation graph.
Figure 7:
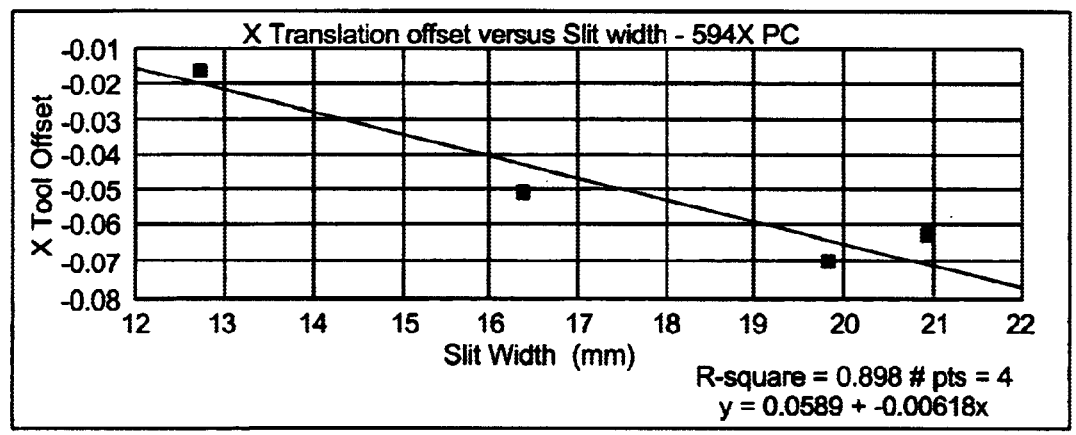
FIG. 7 is a gate level field translation correlation graph.
Figure 8:
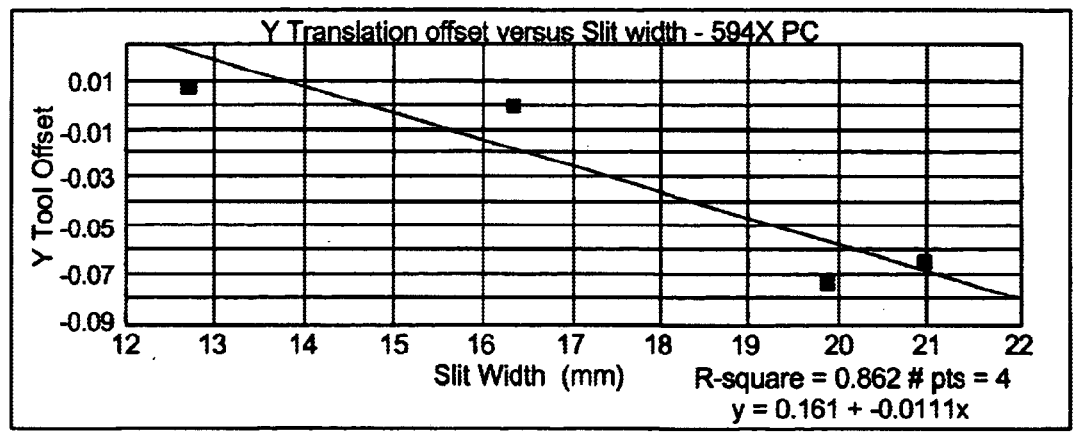
FIG. 8 is a gate level field translation correlation graph.

Next, FIGS. 6 through 8 illustrate gate level field magnification correlation graphs, wherein the data from the gate level aligned data shows a similar dependence of field systematics on field height, as well as X and Y translation.

The correlation between lithographic field size and tool overlay settings exist not only for the first level lithographic process, but also for "level aligning to previous level" lithographic processes. Hence, is the invention applicable to each and every lithographic process step of microchip fabrication.

There are several benefits of the present invention. First, the present invention provides a system for running a feedback method utilizing lithographic exposure field dimensions to predict tool overlay settings. Additionally, the present invention more accurately predicts the tool overlay settings for the first pass through a lithographic photo operation, thereby reducing the likelihood of multiple passes through the lithographic photo operation and incurring wafer rework. Moreover, the present invention uses a feedback sorting criteria to sort historical tool overlay settings. Also, the present invention bases the tool overlay setting prediction on information more specific to the current lot (e.g., discrete exposure field sizes). A further benefit of the present invention is that it implements tool overlay setting prediction system applicable to a lithographic process tool utilizing a projection lens. Furthermore, the present invention reduces cycle time and processing costs associated with integrated circuit chip manufacturing.

While the invention has been described in terms of preferred embodiments, those skilled in the art will recognize that the invention can be practiced with modification within the spirit and scope of the appended claims.

What is claimed is:

1. A method of generating tool overlay settings, said method comprising:
    generating current lot information;
    maintaining historical tool data;
    categorizing said historical tool data into discrete exposure field size ranges;
    retrieving current process tool lithographic field lens distortion data from said historical tool data; and
    predicting current lot tool overlay settings based on said current lot information and said current process tool lithographic field lens distortion data.

2. The method of claim 1, wherein said historical tool data is unique for each tool.

3. The method in claim 1, further comprising maintaining current lot distortion data of previous exposures of said current lot, wherein said predicting is also based on said current lot distortion data.

4. The method in claim 1, wherein said historical tool data comprises field lens distortion data.

5. The method of claim 1, wherein said current lot information comprises field size dimensions.

6. The method of claim 1, wherein said predicting process uses lens distortion data from one of said categories corresponding to a field size dimension of said current lot.

7. The method in claim 1, wherein said discrete exposure field size ranges comprise previous lots of a same bin field size.

8. A method of generating photolightgraphic tool overlay settings comprising:
    maintaining historical tool data;
    categorizing said historical tool data into categories, wherein each category represents a discrete exposure field size;
    providing current lot information of a current lot; and
    predicting overlay settings for said current lot based on said historical tool data and said current lot information.

9. The method in claim 8, wherein said historical tool data is unique for each tool.

10. The method in claim 8, further comprising maintaining current lot distortion data of previous exposures of said current lot, wherein said predicting is also based on said current lot distortion data.

11. The method in claim 8, wherein said historical tool data comprises field lens distortion data.

12. The method of claim 8, wherein said current lot information comprises field size dimensions.

13. The method of claim 8, wherein said predicting process uses lens distortion data from one of said categories corresponding to a field size dimension of said current lot.

14. The method in claim 8, wherein said discrete exposure field size ranges comprise previous lots of a same bin field size.

15. A method of generating photolightgraphic tool overlay settings comprising:
    maintaining historical lens distortion data associated with a specific tool;
    categorizing said historical lens distortion data into categories, wherein each category represents a discrete exposure field size;
    providing current lot field size dimensions of a current lot; and
    predicting overlay settings for said current lot based on said historical lens distortion data and said current lot field size dimensions.

16. The method in claim 15, further comprising maintaining current lot distortion data of previous exposures of said current lot, wherein said predicting is also based on said current lot distortion data.

17. The method of claim 15, wherein said predicting process uses lens distortion data from one of said categories corresponding to a field size dimension of said current lot.

18. The method in claim 15, wherein said discrete exposure field size ranges comprise previous lots of a same bin field size.

19. A system adapted to generate photolightgraphic tool overlay settings comprising:
    a first data generator adapted to maintain historical tool data;
    a sorter adapted to categorize said historical tool data into categories, wherein each category represents a discrete exposure field size;
    a second data generator adapted to provide current lot information of a current lot; and
    an analyzer adapted to predict overlay settings for said current lot based on said historical tool data and said current lot information.

20. The system in claim 19, wherein said historical tool data is unique for each tool.

21. The system in claim 19, further comprising a feedback sorter adapted to maintain current lot distortion data of previous exposures of said current lot, wherein said analyzer also uses said current lot distortion data to predict said overlay settings.

22. The system in claim 19, wherein said historical tool data comprises field lens distortion data.

23. The system of claim 19, wherein said current lot information comprises field size dimensions.

24. The system of claim 19, wherein said analyzer uses lens distortion data from one of said categories corresponding to a field size dimension of said current lot to predict said overlay settings.

25. The system in claim 19, wherein said discrete exposure field size ranges comprise previous lots of a same bin field size.

26. A program storage device readable by machine tangibly embodying a program of instructions executable by said machine, to perform a method of generating photolightgraphic tool overlay settings, said method comprising:
    maintaining historical tool data;
    categorizing said historical tool data into categories, wherein each category represents a discrete exposure field size;
    providing current lot information of a current lot; and
    predicting overlay settings for said current lot based on said historical tool data and said current lot information.

27. The program storage device in claim 26, wherein said historical tool data is unique for each tool.

28. The program storage device in claim 26, wherein said method further comprises maintaining current lot distortion data of previous exposures of said current lot, wherein said predicting is also based on said current lot distortion data.

29. The program storage device in claim 26, wherein said historical tool data comprises field lens distortion data.

30. The program storage device of claim 26, wherein said current lot information comprises field size dimensions.

31. The program storage device of claim 26, wherein said predicting process uses lens distortion data from one of said categories corresponding to a field size dimension of said current lot.

32. The program storage device in claim 26, wherein said discrete exposure field size ranges comprise previous lots of a same bin field size.

* * * * *